(12) United States Patent
Park et al.

(10) Patent No.: US 11,950,487 B2
(45) Date of Patent: Apr. 2, 2024

(54) DISPLAY APPARATUS AND METHOD OF MANUFACTURING THE SAME

(71) Applicant: Samsung Display Co., Ltd., Yongin-si (KR)

(72) Inventors: Joon Seok Park, Yongin-si (KR); Kyoung Seok Son, Seoul (KR); Jun Hyung Lim, Seoul (KR); Masataka Kano, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 25 days.

(21) Appl. No.: 16/562,729

(22) Filed: Sep. 6, 2019

(65) Prior Publication Data

US 2020/0099015 A1 Mar. 26, 2020

(30) Foreign Application Priority Data

Sep. 21, 2018 (KR) .......................... 10-2018-0114265

(51) Int. Cl.
*H10K 71/00* (2023.01)
*H10K 59/123* (2023.01)
(Continued)

(52) U.S. Cl.
CPC .......... *H10K 71/00* (2023.02); *H10K 59/123* (2023.02); *H10K 59/124* (2023.02);
(Continued)

(58) Field of Classification Search
CPC . H01L 51/56; H01L 51/0017; H01L 27/3248; H01L 27/3258; H01L 27/1251;
(Continued)

(56) References Cited

U.S. PATENT DOCUMENTS 8,450,733 B2 5/2013 Wang et al.
9,065,077 B2 6/2015 Hung et al.
(Continued)

FOREIGN PATENT DOCUMENTS

CN 103578984 A * 2/2014 ......... H01L 29/7869
JP 2012-256874 12/2012
(Continued)

OTHER PUBLICATIONS

Ge et al., 2018. 53-2: Development of Cu BCE-structure IGZO TFT for High-ppi 85-in. 8K × 4K 120Hz GOA LCD. SID Symposium Digest of Technical Papers. 49. 702-705.
(Continued)

*Primary Examiner* — Shahed Ahmed
*Assistant Examiner* — Sun Mi Kim King
(74) *Attorney, Agent, or Firm* — H.C. Park & Associates, PLC

(57) ABSTRACT

A display apparatus including a base substrate, a first thin film transistor disposed on the base substrate, a via insulation layer disposed on the first thin film transistor, and a light emitting structure disposed on the via insulation layer. The first thin film transistor includes a first gate electrode, an oxide semiconductor overlapped with the first gate electrode, and including tin (Sn), an etch stopper disposed on the oxide semiconductor and including an oxide semiconductor material which does not include tin (Sn), a first source electrode making contact with the oxide semiconductor, and a first drain electrode making contact with the oxide semiconductor, and spaced apart from the first source electrode.

8 Claims, 18 Drawing Sheets

(51) Int. Cl.
*H10K 59/124* (2023.01)
*H10K 71/20* (2023.01)
*H10K 102/10* (2023.01)

(52) U.S. Cl.
CPC ..... *H10K 71/231* (2023.02); *H10K 2102/102* (2023.02); *H10K 2102/103* (2023.02)

(58) Field of Classification Search
CPC ............ H01L 27/3262; H01L 27/3244; H01L 27/1214; H10K 71/00; H10K 59/123; H10K 59/124; H10K 71/231; H10K 102/102; H10K 102/103
USPC .......................................................... 257/40
See application file for complete search history.

(56) References Cited

U.S. PATENT DOCUMENTS

| | | | |
|---|---|---|---|
| 9,954,070 B2 | 4/2018 | Wang et al. | |
| 2010/0176399 A1 | 7/2010 | Takeguchi | |
| 2010/0224878 A1* | 9/2010 | Kimura | H01L 27/124 257/E29.296 |
| 2014/0061635 A1 | 3/2014 | Liu | |
| 2015/0091000 A1 | 4/2015 | Morita et al. | |
| 2015/0179681 A1 | 6/2015 | Sato | |
| 2015/0255584 A1 | 9/2015 | Sasagawa et al. | |
| 2015/0295058 A1 | 10/2015 | Morita et al. | |
| 2015/0318400 A1 | 11/2015 | Morita et al. | |
| 2016/0204177 A1* | 7/2016 | Kim | H01L 27/1222 257/40 |
| 2016/0284853 A1* | 9/2016 | Pham | H01L 29/66969 |
| 2016/0343834 A1* | 11/2016 | Xu | H01L 27/1225 |
| 2017/0062539 A1 | 3/2017 | Tsai et al. | |
| 2018/0374956 A1* | 12/2018 | Lee | G02F 1/134309 |
| 2019/0386149 A1* | 12/2019 | Yu | H01L 27/127 |
| 2022/0115515 A1 | 4/2022 | Kimura | |

FOREIGN PATENT DOCUMENTS

| | | | |
|---|---|---|---|
| JP | 2015-122417 | | 7/2015 |
| KR | 20120080883 A | * | 7/2012 |
| KR | 20150005591 | | 1/2015 |
| KR | 10-2015-0029843 A | | 3/2015 |
| KR | 10-2015-0068746 A | | 6/2015 |
| KR | 20150068746 A | * | 6/2015 |
| KR | 10-2015-0141452 A | | 12/2015 |
| KR | 10-2017-0044167 | | 2/2017 |
| KR | 10-1774256 B1 | | 9/2017 |
| KR | 10-2018-0025316 | | 3/2018 |

OTHER PUBLICATIONS

Korean Office Action dated Feb. 14, 2024, in Korean Patent Application No. 10-2018-0114265 (with English translation).

* cited by examiner

DISPLAY APPARATUS AND METHOD OF MANUFACTURING THE SAME

CROSS REFERENCE TO RELATED APPLICATION

This application claims priority from and the benefit of Korean Patent Application No. 10-2018-0114265, filed on Sep. 21, 2018, which is hereby incorporated by reference for all purposes as if fully set forth herein.

BACKGROUND

Field

Exemplary embodiments of the invention relate generally to a display apparatus and a method of manufacturing the display apparatus and, more specifically, to a display apparatus capable of improving display quality and a method of manufacturing the display apparatus.

Discussion of the Background

Recently, a display apparatus having light weight and a small size has recently been manufactured. A cathode ray tube (CRT) display apparatus has been used as a result of good performance and a competitive price. However, the CRT display apparatus suffers from various drawbacks, such as high power consumption and a relatively large size resulting in lack of portability. Therefore a display apparatus, such as a plasma display apparatus, a liquid crystal display apparatus, and an organic light emitting display apparatus has been highly regarded due to small size, light weight, and low power-consumption.

The display apparatus includes a plurality of pixels including a thin film transistor. A dispersion of the thin film transistors affects the display quality, so that efforts have been made to reduce the dispersion.

The above information disclosed in this Background section is only for understanding of the background of the inventive concepts, and, therefore, it may contain information that does not constitute prior art.

SUMMARY

Exemplary embodiments of the inventive concept provide a display apparatus capable of improving a display quality.

Exemplary embodiments of the inventive concept also provide a method of manufacturing the display apparatus.

Additional features of the inventive concepts will be set forth in the description which follows, and in part will be apparent from the description, or may be learned by practice of the inventive concepts.

An exemplary embodiment of the inventive concept provides a display apparatus including a base substrate, a first thin film transistor disposed on the base substrate, a via insulation layer disposed on the first thin film transistor, and a light emitting structure disposed on the via insulation layer. The first thin film transistor includes a first gate electrode, an oxide semiconductor overlapped with the first gate electrode, and including tin (Sn), an etch stopper disposed on the oxide semiconductor and including an oxide semiconductor material which does not include tin (Sn), a first source electrode making contact with the oxide semiconductor, and a first drain electrode making contact with the oxide semiconductor, and spaced apart from the first source electrode.

The gate electrode may be disposed between the base substrate and the oxide semiconductor.

The etch stopper may cover only a portion of an upper surface of the oxide semiconductor. The first source electrode and the first drain electrode may make contact with the upper surface of the oxide semiconductor.

Contact holes may be formed through the etch stopper to expose an upper surface of the oxide semiconductor. The first source electrode and the first drain electrode may make contact with the oxide semiconductor through the contact holes.

The oxide semiconductor may include at least one selected from the group consisting of tin oxide ($SnO_x$), indium tin oxide (ITO), zinc-tin oxide (ZTO), zinc-tin oxide (IZTO), tin-aluminum-zinc-oxide (TAZO), indium-gallium-tin oxide (IGTO), and indium-gallium-zinc-tin-oxide (IGZTO). The etch stopper may include at least one selected from the group consisting of zinc oxide ($ZnO_x$), gallium oxide ($GaO_x$), titanium oxide ($TiO_x$), indium oxide ($InO_x$), indium-gallium oxide (IGO), indium-zinc oxide (IZO), Gallium-zinc oxide (GZO), zinc-magnesium oxide (ZMO), zinc-zirconium oxide ($ZnZr_xO_y$), indium-gallium-zinc oxide (IGZO) and indium-gallium-hafnium oxide (IGHO).

The display apparatus may further include an interlayer insulation layer disposed on the first gate electrode and the oxide semiconductor, and a second thin film transistor disposed on the base substrate. The second thin film transistor may include an active pattern disposed on the base substrate, a second gate electrode disposed on the active pattern, and a second source electrode and a second drain electrode, which are disposed on the interlayer insulation layer and electrically connected to the active pattern.

The light emitting structure may include a first electrode electrically connected to the second thin film transistor, a light emitting layer disposed on the first electrode, and a second electrode disposed on the light emitting layer.

The display apparatus may include a plurality of pixels to display an image. Each of the pixel may include the first thin film transistor, the second thin film transistor, and the light emitting structure.

The second gate electrode may include a storage electrode overlapped with the second gate electrode.

Another exemplary embodiment of the inventive concept provides a display apparatus including a base substrate, a gate electrode disposed on the base substrate, an oxide semiconductor overlapped with the gate electrode, and including tin (Sn), an etch stopper disposed on the oxide semiconductor and including an oxide semiconductor material which does not include tin (Sn), a source electrode making contact with the oxide semiconductor, and a drain electrode making contact with the oxide semiconductor, and spaced apart from the source electrode.

Another exemplary embodiment of the inventive concept provides a method of manufacturing a display apparatus including forming a first gate electrode on a base substrate, forming an interlayer insulation layer on the first gate electrode, sequentially forming an oxide semiconductor layer and an etch stopper layer on the interlayer insulation layer, forming a photoresist pattern having a first thickness and a second thickness on the etch stopper layer, forming an oxide semiconductor and an etch stopper pattern by etching the etch stopper layer and the oxide semiconductor layer using the photoresist pattern as an etching barrier, exposing a portion of an upper surface of the etch stopper pattern by partially removing the photoresist pattern, forming an etch stopper by etching the etch stopper pattern using the photoresist pattern as an etching barrier, forming a conductive layer on the etch stopper, the oxide semiconductor layer and the interlayer insulation layer, and forming a first source electrode and a first drain electrode by etching the conductive layer.

The oxide semiconductor may include an oxide semiconductor material including tin (Sn). The etch stopper may include an oxide semiconductor material which does not include tin (Sn).

The oxide semiconductor may include at least one selected from the group consisting of tin oxide (SnOx), indium tin oxide (ITO), zinc-tin oxide (ZTO), zinc-tin oxide (IZTO), tin-aluminum-zinc-oxide (TAZO), indium-gallium-tin oxide (IGTO) and indium-gallium-zinc-tin-oxide (IG-ZTO). The etch stopper may include at least one selected from the group consisting of zinc oxide ($ZnO_x$), gallium oxide ($GaO_x$), titanium oxide ($TiO_x$), indium oxide ($InO_x$), indium-gallium oxide (IGO), indium-zinc oxide (IZO), Gallium-zinc oxide (GZO), zinc-magnesium oxide (ZMO), zinc-zirconium oxide ($ZnZr_xO_y$), indium-gallium-zinc oxide (IGZO) and indium-gallium-hafnium oxide (IGHO).

The etch stopper layer and the oxide semiconductor layer may be wet-etched by an etching solution of hydrofluoric acid or oxalic acid series.

The etch stopper pattern may be wet-etched by an etching solution of phosphoric-nitric-acetic acid series.

The conductive layer may be dry-etched by a fluorine-based gas.

The method may further include forming an active pattern on the base substrate, and forming a second gate electrode on the active pattern. A second source electrode and a second drain electrode electrically connected to the active pattern may be further formed by etching the etching the conductive layer.

The method may further include forming a storage electrode overlapping the second gate electrode on the second gate electrode before forming the interlayer insulation layer. The storage electrode and the first gate electrode may be formed from the same layer.

The active pattern may include poly-crystal silicon.

The etch stopper may cover only a portion of an upper surface of the oxide semiconductor. The first source electrode and the first drain electrode may make contact with the upper surface of the oxide semiconductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
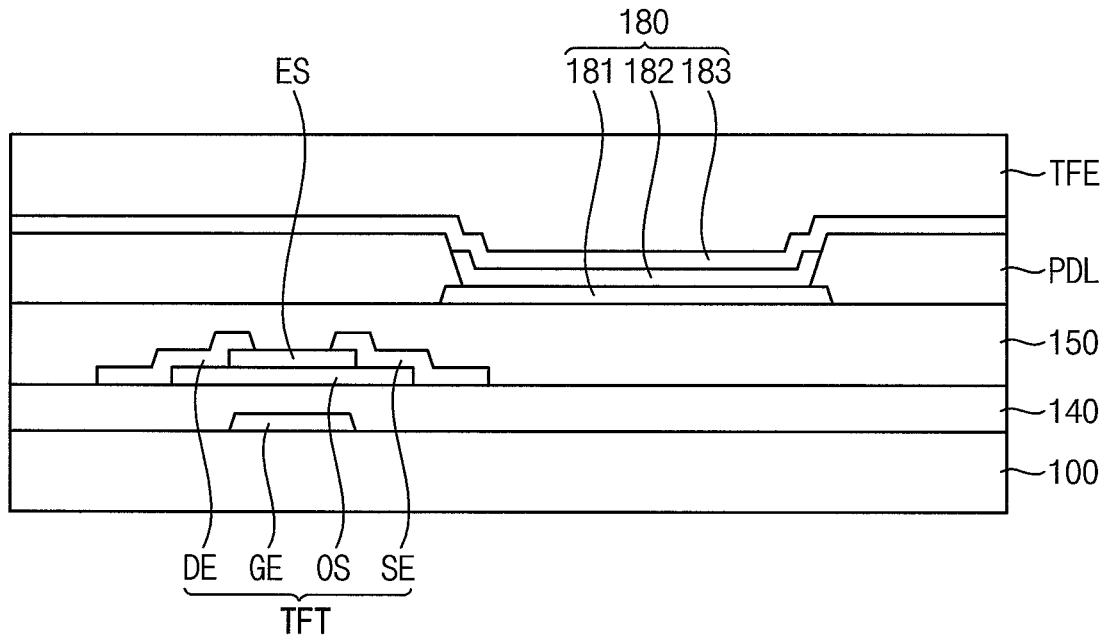
FIG. 1 is a cross-sectional view illustrating a display apparatus according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view illustrating a display apparatus according to an exemplary embodiment of the inventive concept.

Referring to FIG. 1, the display apparatus may include a base substrate 100, a gate electrode GE, an interlayer insulation layer 140, an oxide semiconductor OS, an etch stopper ES, a drain electrode DE, a source electrode SE, a via insulation layer 150, a light emitting structure 180, a pixel defining layer PDL, and a thin film encapsulation layer TFE.

The base substrate 100 including transparent or opaque insulation materials may be provided. For example, the base substrate 100 may include a quartz substrate, a synthetic quartz substrate, a calcium fluoride substrate, a fluoride-doped quartz substrate, a sodalime glass substrate, a non-alkali glass substrate etc. Alternatively, the base substrate 100 may include a flexible transparent material, such as a flexible transparent resin substrate (e.g., a polyimide substrate). In this case, the polyimide substrate may include a first polyimide layer, a barrier film layer, a second polyimide layer, etc. For example, the polyimide substrate may have a configuration where the first polyimide layer, the barrier film layer, and the second polyimide layer, are stacked on the a rigid glass substrate.

The gate electrode GE may be disposed on the base substrate 100. The gate electrode GE may be formed using a metal, an alloy, a metal nitride, a conductive metal oxide, a transparent conductive material, or the like.

The interlayer insulation layer 140 may be disposed on the gate electrode GE. the interlayer insulation layer 140 may sufficiently cover the gate electrode GE on the base substrate 100, and may have a substantially flat upper surface without a step around the gate electrode GE. Alternatively, the interlayer insulation layer 140 may cover the gate electrode GE on the base substrate 100, and may be disposed with a substantially uniform thickness along a profile of the gate electrode GE The interlayer insulation layer 140 may include silicon compound, metal oxide, etc. For example, the interlayer insulation layer 140 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. The interlayer insulation layer 140 may be formed of a plurality of layers.

The oxide semiconductor OS may be disposed on the interlayer insulation layer 140. The oxide semiconductor OS may overlap the gate electrode GE. The oxide semiconductor (OS) may be an oxide semiconductor including tin (Sn). The oxide semiconductor OS may further include indium (In), zinc (Zn), gallium (Ga), titanium (Ti), aluminum (Al), hafnium (Hf), zirconium (Zr), magnesium (Mg), and may be an oxide semiconductor layer at least one of two-component compound ($AB_x$), ternary compound ($AB_xC_y$), four-component compound ($AB_xC_yD_z$), etc.

For example, the oxide semiconductor OS may be at least one selected from the group consisting of tin oxide ($SnO_x$), indium tin oxide (ITO), zinc-tin oxide (ZTO), zinc-tin oxide (IZTO), tin-aluminum-zinc-oxide (TAZO), indium-gallium-tin oxide (IGTO), indium-gallium-zinc-tin-oxide (IGZTO), and the like. Since the oxide semiconductor OS includes tin, a semiconductor having higher mobility than an oxide semiconductor containing no tin can be realized.

The etch stopper ES may be disposed on the oxide semiconductor OS. The etch stopper ES may have a smaller size than the oxide semiconductor OS. That is, the etch stopper ES may cover only a portion of an upper surface of the oxide semiconductor OS to expose an edge portion of the upper surface of the oxide semiconductor OS. The etch stopper ES may include an oxide semiconductor material that does not include tin. The etch stopper ES may be an oxide semiconductor layer, which includes a two-component compound ($AB_x$), a ternary compound ($AB_xC_y$), a four-component compound ($AB_xC_yD_z$), etc., which may include indium, zinc, gallium, tin, titanium, aluminum, hafnium, zirconium, and magnesium.

For example, the etch stopper ES may include zinc oxide (ZnOx), gallium oxide ($GaO_x$), titanium oxide ($TiO_x$), indium oxide ($InO_x$), indium-gallium oxide (IGO), indium-zinc oxide (IZO), Gallium-zinc oxide (GZO), zinc-magnesium oxide (ZMO), zinc-zirconium oxide ($ZnZr_xO_y$), indium-gallium-zinc oxide (IGZO), indium-gallium-hafnium oxide (IGHO), etc.

The drain electrode DE may be disposed on the interlayer insulation layer 140 on which the oxide semiconductor OS and the etch stopper ES are disposed. The drain electrode DE may make contact with and be connected to the etch stopper ES and the oxide semiconductor OS. That is, the drain electrode DE may directly contact an upper edge of the oxide semiconductor OS exposed by the etch stopper ES.

The source electrode SE may be spaced apart from the drain electrode DE on the interlayer insulation layer 140 on which the oxide semiconductor OS and the etch stopper ES are disposed. The source electrode SE may make contact with and be connected to the etch stopper ES and the oxide semiconductor OS. That is, the source electrode SE may directly contact an upper edge of the oxide semiconductor OS exposed by the etch stopper ES.

The drain electrode DE and the source electrode SE may be formed using a metal, an alloy, a metal nitride, a conductive metal oxide, a transparent conductive material, or the like. The drain electrode DE and the source electrode SE may be formed of a plurality of layers. For example, the drain electrode DE and the source electrode SE may include a titanium (Ti) layer and a molybdenum (Mo) layer on the titanium layer (Ti/Mo structure). Alternatively, the drain electrode DE and the source electrode SE may include a titanium (Ti) layer, an aluminum (Al) layer on the titanium layer and a titanium (Ti) layer on the aluminum layer (Ti/Al/Ti structure)

The gate electrode GE, the oxide semiconductor OS, the etch stopper ES, and the source and drain electrodes SE and DE may be included in a thin film transistor TFT. The thin film transistor TFT may have a bottom gate structure.

The thin film transistor TFT has the bottom gate structure, has a channel length less than that of a top gate structure, and does not need to form a separate contact hole. When the source and drain electrodes SE and DE are patterned, since the etch stopper ES protects the oxide semiconductor OS, thickness and size of the oxide semiconductor OS are constant, thereby reducing dispersion of a plurality of thin film transistors included in the display apparatus. In addition, since the source and drain electrodes SE and DE can be patterned by a dry etching process, the size of the thin film transistor TFT can be further reduced. Accordingly, this is advantageous for realizing a high-resolution display apparatus.

The via insulation layer 150 may be disposed on the thin film transistor TFT. The via insulation layer 150 may have a single-layered structure or a multi-layered structure including at least two insulation films. The via insulation layer 150 may be formed using an organic material. For example, the via insulation layer 150 may include photoresist, acryl-based resin, polyimide-based resin, polyamide-based resin, siloxane-based resin, etc. In some exemplary embodiments, the via insulation layer 150 may include inorganic material, such as a silicon compound, metal oxide, etc.

The light emitting structure 180 may include a first electrode 181, an emission layer 182 and a second electrode 183.

The first electrode 181 may be disposed on the via insulation layer 150. The first electrode 181 may include a reflective material or a transmissive material in accordance with the emission type of the display apparatus. In exemplary embodiments, the first electrode 181 may have a single layer structure or a multi layer structure, which may include a metal film, an alloy film, a metal nitride film, a conductive metal oxide film and/or a transparent conductive film.

The pixel defining layer PDL may be disposed on the via insulation layer 150 on which the first electrode 181 is disposed. The pixel defining layer PDL may be formed using an organic material. For example, the pixel defining layer PDL may include photoresist, an acryl-based resin, a polyimide-based resin, a polyamide-based resin, a siloxane-based resin, etc. In some exemplary embodiments, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. In some exemplary embodiments, the light emitting layer 182 may include an organic light emitting layer (EL), a hole injection layer (HIL), a hole transfer layer (HTL), an electron transfer layer (ETL), an electron injection layer (EIL), etc. In some exemplary embodiments, except for the organic emission layer, the hole injection layer, the hole transport layer, the electron transport layer, and the electron injection layer may be formed in common to correspond to a plurality of pixels. In some exemplary embodiments, a plurality of organic light emitting layers may be formed using light emitting materials for generating different colors of light such as a red color of light, a green color of light and a blue color of light in accordance with color pixels of the display device. In some exemplary embodiments, the organic light emitting layer of the of the light emitting layer 182 may include a plurality of stacked light emitting materials for generating a red color of light, a green color of light, and a blue color of light to thereby emitting a white color of light. Here, elements of the light emitting layer 182 are commonly formed so as to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. In exemplary embodiments, the second electrode 183 may also have a single layer structure or a multi layer structure, which may include a metal film, an alloy film, a metal nitride film, a conductive metal oxide film, and/or a transparent conductive film.

The thin film encapsulation layer TFE may be disposed on the second electrode 183. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, but is not limited thereto. In some exemplary embodiments, it is possible to provide a sealing substrate for shielding outside air and moisture from penetrating into the display apparatus instead of the thin film encapsulation layer TFE.

Figure 11:
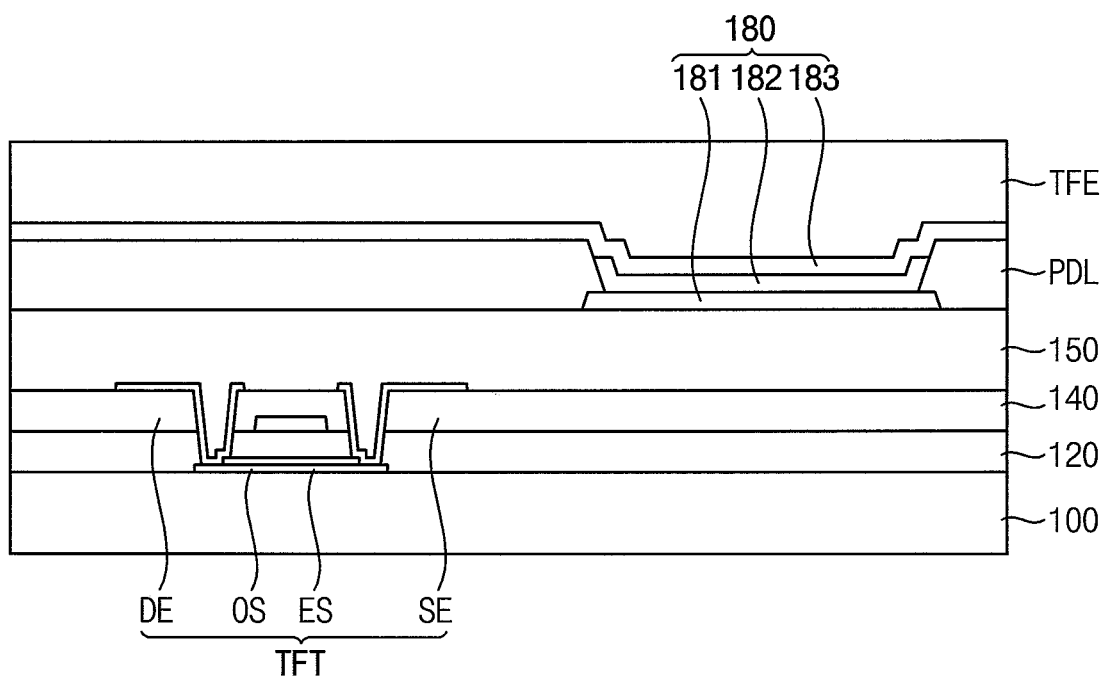
FIG. 11 is a cross-sectional view illustrating a display apparatus according to an exemplary embodiment of the inventive concept.

On the other hand, in the present exemplary embodiment, the thin film transistor has the bottom gate structure, but may also have a top gate structure. For example, referring to FIG. 11, the display apparatus may include an oxide semiconductor OS disposed on a base substrate 100, an etch stopper OS disposed on the oxide semiconductor, a gate insulation layer 120 disposed on the etch stopper OS, a gate electrode GE overlapped with the oxide semiconductor OS on the gate insulation layer 120, an interlayer insulation layer 140 disposed on the gate electrode, and a source electrode SE and a drain electrode 140 disposed on the interlayer insulation layer 140.

The source electrode SE and the drain electrode DE may be connected to the oxide semiconductor OS through contact holes formed through the interlayer insulation layer 140 and the gate insulation layer 120. Here, the contact holes may expose a portion of the etch stopper ES so that the source electrode SE and the drain electrode DE contact the etch stopper ES. Although not shown, according to another exemplary embodiment, the source electrode SE and the drain electrode DE may be arranged not to contact the etch stopper ES.

In addition, the display apparatus may further include a via insulation layer 150, a light emitting structure 180, a pixel defining layer PDL, and a thin film encapsulation layer TFE.

Since each configuration of the display apparatus is substantially the same as each configuration of the display apparatus of FIG. 1, a detailed description will be omitted.

Figure 2:
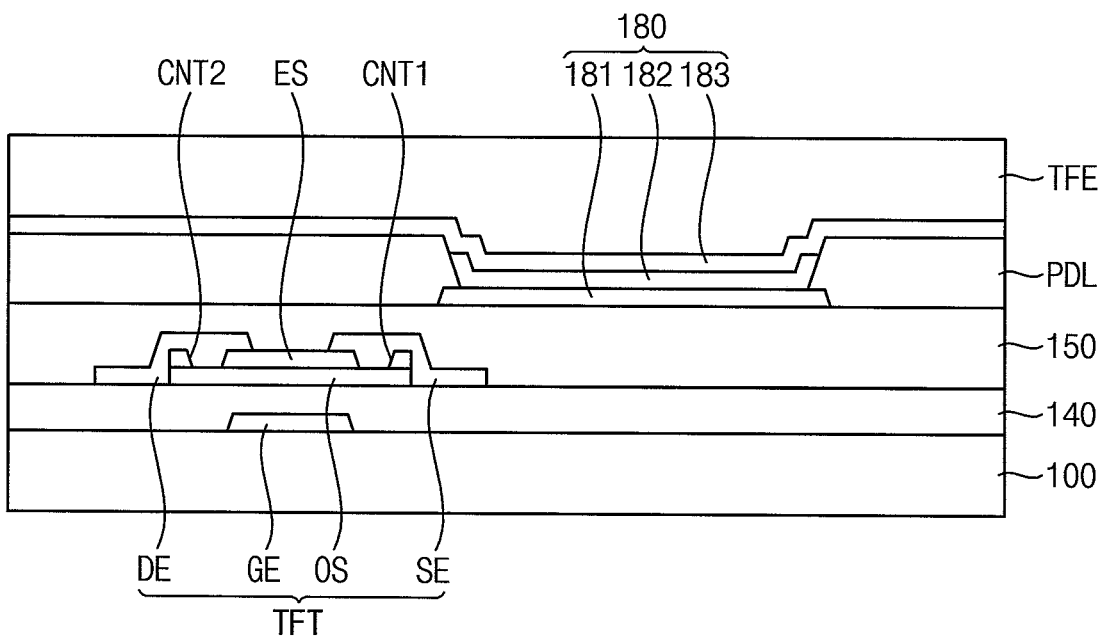
FIG. 2 is a cross-sectional view illustrating a display apparatus according to an exemplary embodiment of the inventive concept.

FIG. 2 is a cross-sectional view illustrating a display apparatus according to an exemplary embodiment of the inventive concept.

Referring to FIG. 2, the display apparatus is substantially the same as the display apparatus of FIG. 1 except for an etch stopper ES. Therefore, repeated explanation will be omitted.

The display apparatus may include a base substrate 100, a gate electrode GE, an interlayer insulation layer 140, an oxide semiconductor OS, an etch stopper ES, a drain electrode DE, a source electrode SE, a via isolation layer 150, a light emitting structure 180, a pixel definition layer PDL, and a thin film encapsulation layer TFE.

A first contact hole CNT1 and a second contact hole CNT2 may be formed through the etch stopper ES. The first contact hole CNT1 and the second contact hole CNT2 may expose an upper surface of the oxide semiconductor OS. The source electrode SE may contact the upper surface of the oxide semiconductor OS through the first contact hole CNT1. The drain electrode DE may contact the upper surface of the oxide semiconductor OS through the second contact hole CNT2.

Figure 3:
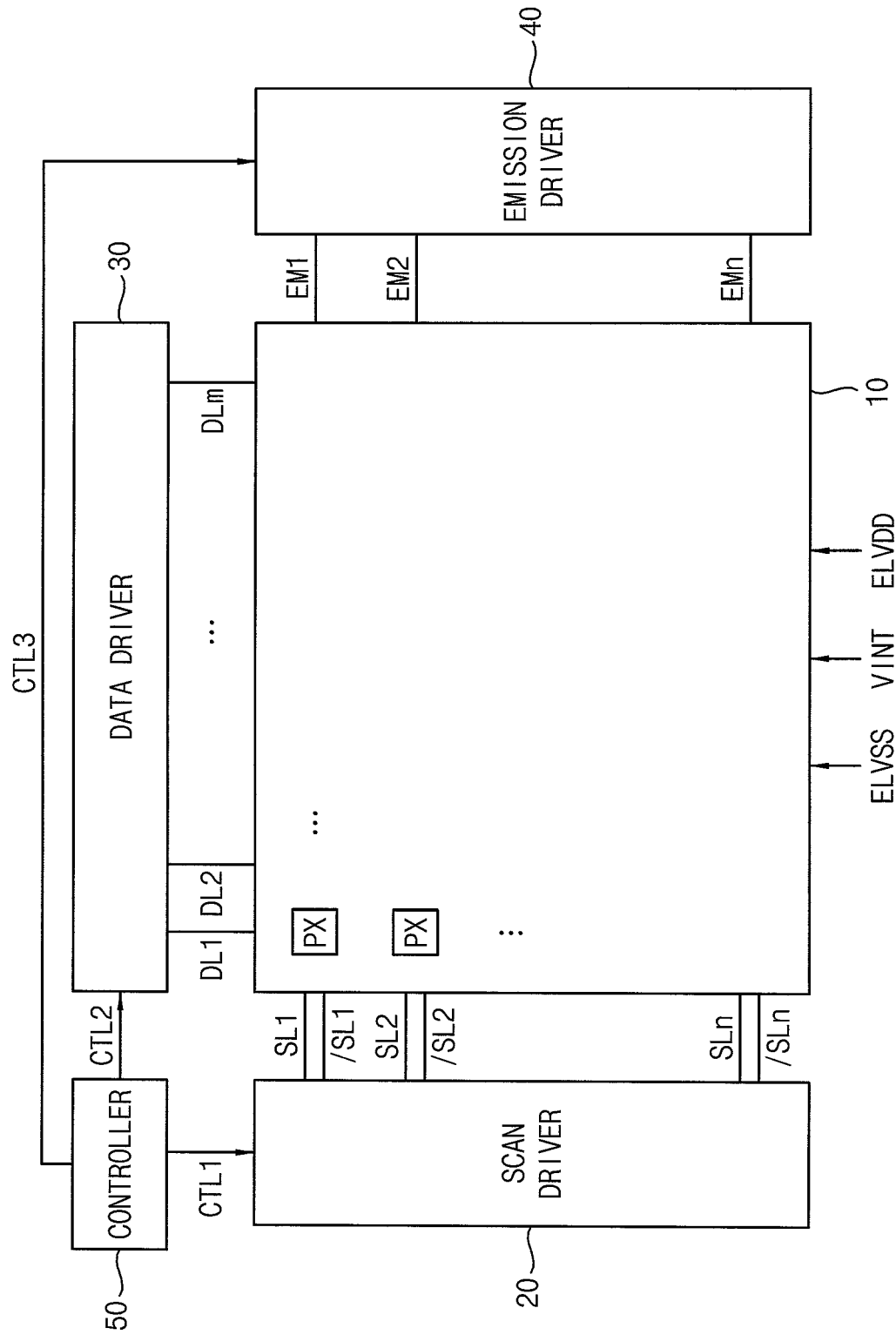
FIG. 3 is a block diagram illustrating a display apparatus according to an exemplary embodiment of the inventive concept.

FIG. 3 is a block diagram illustrating a display apparatus according to an exemplary embodiment of the inventive concept.

Referring to FIG. 3, the display apparatus may include a display panel 10, a scan driver 20, a data driver 30, an emission control driver 40, and a controller 50.

The display panel 10 may include a plurality of pixels PX to display an image. For example, the display panel 100 may include n*m pixels PX because the pixels PX are arranged at locations corresponding to crossing points of the scan lines SL1 through SLn and the data lines DL1 through DLm, where n and m are integers greater than 1. Each of the pixels PX may include a driving transistor and a plurality of switching transistors. The structure of the pixel PX will be described in detail with reference to FIG. 4.

The scan driver 20 may progressively provide a first scan signal to the pixels PX via the scan lines SL1 through SLn based on a first control signal CTL1. The scan driver 20 may progressively provide a second scan signal to the pixels PX via inverted scan lines /SL1 through /SLn based on a first control signal CTL1. For example, the second scan signal may correspond to a signal inverted to the first scan signal.

The data driver 30 may provide a data signal to the pixels PX via the data lines DL1 through DLm based on a second control signal CTL2.

The emission control driver 40 may provide an emission control signal to the pixels PX via the emission control lines EM1 through EMn based on a third control signal CTL3.

The controller 50 may control the scan driver 20, the data driver 30, and the emission control driver 40. The controller 50 may generate the control signals CTL1, CTL2, CTL3 to control the scan driver 20, the data driver 30, and the emission control driver 40. The first control signal CTL1 for controlling the scan driver 20 may include a vertical start signal, scan clock signals, etc. The second control signal CTL2 for the controlling the data driver 30 may include digital image data, a horizontal start signal, etc. The third control signal CTL3 for the controlling the emission control driver 40 may include an emission control start signal, emission control clock signals, etc.

Further, the organic light emitting display apparatus may further include a power supply (not illustrated) providing a first power voltage ELVDD, a second power voltage ELVSS, and an initialization voltage VINT to the display panel 10.

Figure 4:
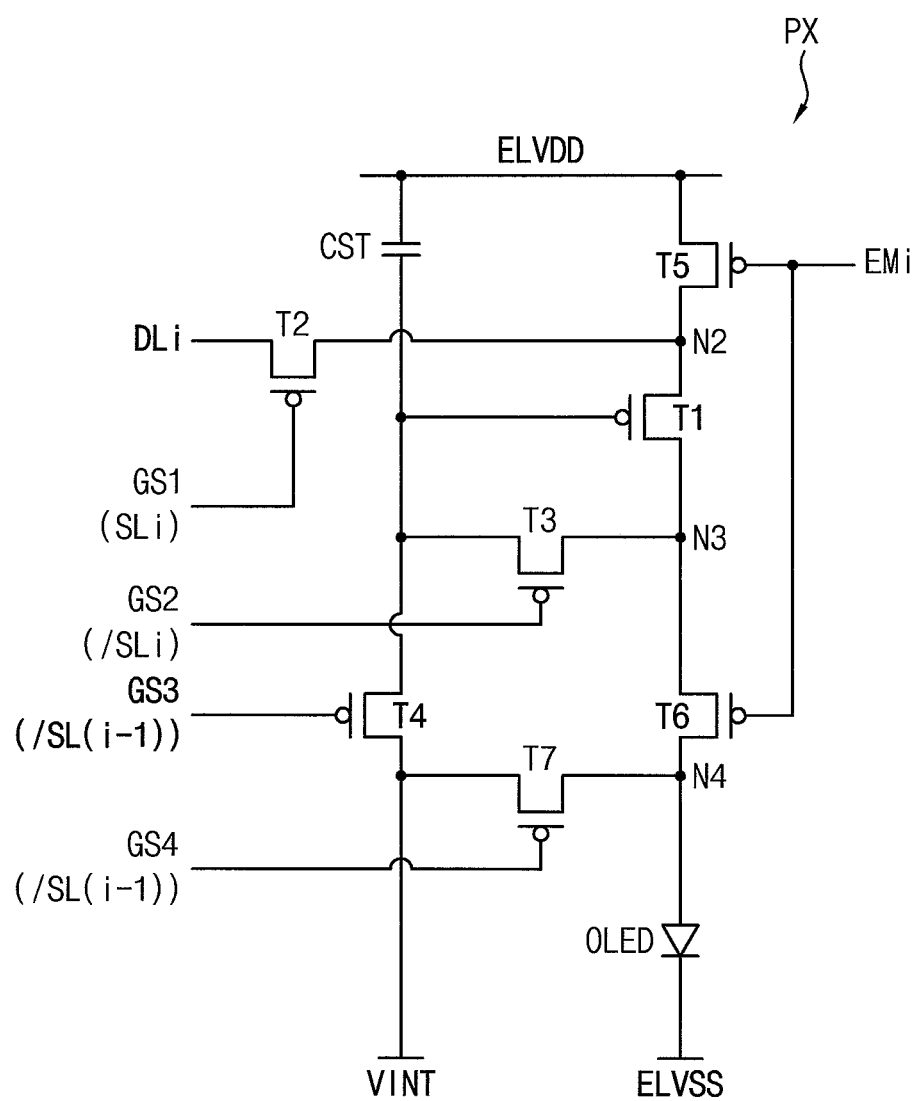
FIG. 4 is a diagram illustrating one example of a pixel included in the display apparatus of FIG. 3.

FIG. 4 is a diagram illustrating one example of a pixel included in the display apparatus of FIG. 3.

Referring to FIG. 4, the pixel PX-1 may include first through seventh transistors T1 through T7, a storage capacitor CST, a first capacitor C1, and an organic light emitting diode OLED. The pixel PX-1 may be located at the (i)th pixel row and the (j)th pixel column, where i is an integer between 1 and n, and j is an integer between 1 and m.

The first transistor T1 may be a driving transistor providing a driving current corresponding to a data signal to the OLED. The first transistor T1 may include a gate electrode connected to the first node N1, a first electrode connected to the second node N2, and a second electrode connected to the third node N3.

The second transistor T2 may provide a data signal to the first transistor T1 in response to a first scan signal GS1. In one exemplary embodiment, the second transistor T2 may include a gate electrode receiving the first scan signal GS1 from the (i)th scan line SLi, a first electrode receiving the data signal from the (j)th data line DLj, and a second electrode connected to the first electrode of the first transistor T1 (i.e., the second node N2).

The third transistor T3 may connect the second electrode of the first transistor T1 to the gate electrode of the first transistor T1 in response to a second scan signal GS2. In one exemplary embodiment, the third transistor T3 may include a gate electrode receiving the second scan signal GS2 from the (i)th inverted scan line /SLi, a first electrode connected to the second electrode of the first transistor T1 (i.e., the third node N3), and a second electrode connected to the gate electrode of the first transistor T1 (i.e., the first node N1).

The fourth transistor T4 may apply the initialization voltage VINT to the gate electrode of the first transistor T1 in response to a third scan signal GS3. In one exemplary embodiment, the fourth transistor T4 may include a gate electrode receiving the third scan signal GS3 from the (i−1)th inverted scan line /SL(i−1), a first electrode receiving an initialization voltage VINT, and a second electrode connected to the gate electrode of the first electrode T1 (i.e., the first node N1).

The fifth transistor T5 may apply the first power voltage ELVDD to the first electrode of the first transistor T1 in response to the emission control signal. In one exemplary embodiment, the fifth transistor T5 may include a gate electrode receiving the emission control signal from the (i)th emission control line EMi, a first electrode receiving the first power voltage ELVDD, and a second electrode connected to the first electrode of the first transistor T1 (i.e., the second node N2).

The sixth transistor T6 may connect the second electrode of the first transistor T1 to the first electrode of the OLED in response to the emission control signal. In one exemplary embodiment, the sixth transistor T6 may include a gate electrode receiving the emission control signal from the (i)th emission control line EMi, a first electrode connected to the second electrode of the first transistor T1 (i.e., the third node N3), and a second electrode connected to the first electrode of the OLED (i.e., a fourth node N4).

The seventh transistor T7 may apply the initialization voltage VINT to the first electrode of the OLED in response to the fourth scan signal GS4. In one exemplary embodiment, the seventh transistor T7 may include a gate electrode receiving the fourth scan signal GS4 from the (i−1)th inverted scan line /SL(i−1), a first electrode receiving the initialization voltage VINT, and a second electrode connected to the first electrode of the OLED (i.e., the fourth node N4).

Here, each of the first transistor T1, the second transistor T2, the fifth transistor T5, and the sixth transistor T6 may be poly-Si thin film transistors, which is P-Type transistor. (Refer to TFT2 in FIG. 5) Each of the third transistor T3, the fourth transistor T4 and the seventh transistor T7 may be an oxide thin film transistor, which is N-type transistor. (Refer to TFT1 in FIG. 5)

The storage capacitor CST may include a first electrode receiving the first power voltage ELVDD and a second electrode connected to the gate electrode of the first transistor T1 (i.e., the first node N1).

Figure 5:
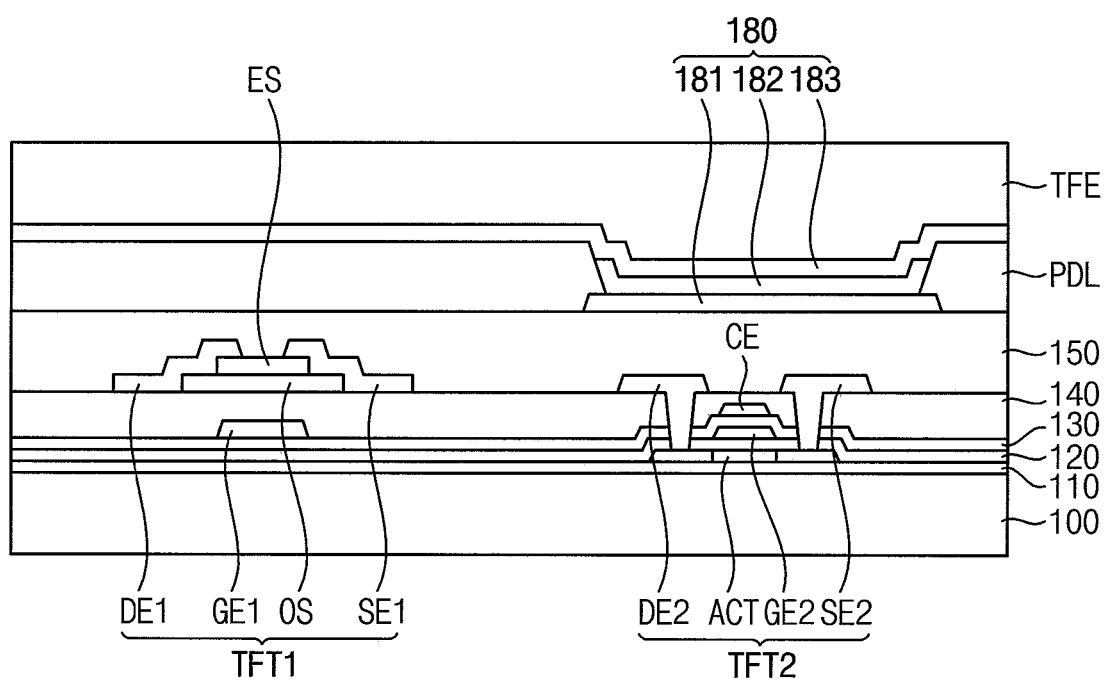
FIG. 5 is a cross-sectional view illustrating the display apparatus of FIGS. 3 and 4.

FIG. 5 is a cross-sectional view illustrating the display apparatus of FIGS. 3 and 4.

Referring to FIG. 5, the display apparatus may include a base substrate 100, a buffer layer 110, an active pattern ACT, a first gate insulation layer 120, a first gate pattern, a second gate insulation layer 130, a second gate pattern, an interlayer insulation layer 140, an oxide semiconductor OS, an etch stopper, a source-drain pattern, a via insulation layer 140, a light emitting structure 180, a pixel defining layer PDL, and a thin film encapsulation layer TFE.

The base substrate 100 including transparent or opaque insulation materials may be provided. The base substrate 100 may include a flexible transparent material such as a flexible transparent resin substrate.

The buffer layer 110 may be disposed on the base substrate 100. The buffer layer 110 may be disposed on the entire base substrate 100. The buffer layer 110 may prevent the diffusion of metal atoms and/or impurities from the substrate 100 into the active pattern ACT. In addition, the buffer layer 110 may control a rate of a heat transfer in a crystallization process for forming the active pattern ACT, thereby obtaining a substantially uniform active pattern ACT. In addition, the buffer layer 110 may improve flatness of a surface of the base substrate 100 when the surface of the base substrate 100 is not uniform.

The active pattern ACT may be disposed on the buffer layer 110. The active pattern ACT may include poly-crystal silicon. The active pattern ACT may include drain and source regions doped with an impurity and a channel region between the drain region and the source region. The poly-crystal silicon may be formed by first depositing amorphous silicon and then crystallizing it. Here, the amorphous silicon may be crystallized by rapid thermal annealing (RTA), solid phase crystallization (SPC), excimer laser annealing (ELA), metal induced crystallization (MIC), metal induced lateral crystallization (MILC), sequential lateral solidification (SLS), and the like. An impurity may be doped in portions of the active pattern ACT to form the source region and the drain region.

The first gate insulation layer 120 may cover the active pattern ACT on the buffer layer 110, and may be disposed as a substantially uniform thickness along a profile of the active pattern ACT. Alternatively, the first gate insulation layer 120 may sufficiently cover the active pattern ACT on the buffer layer 110, and may have a substantially flat upper surface without a step around the active pattern ACT.

The first gate pattern may be disposed on the first gate insulation layer 120. The first gate pattern may include a second gate electrode GE2. The first gate pattern may further include a signal line such as a gate line for driving the display apparatus. The first gate pattern may be formed using a metal, an alloy, a metal nitride, a conductive metal oxide, a transparent conductive material, or the like.

The second gate insulation layer 130 may be disposed on the first gate insulation layer 120 on which the first gate pattern is disposed. The second gate insulation layer 130 may cover the first gate pattern on the first gate insulation layer 120, and may be disposed with a substantially uniform thickness along a profile of the first gate pattern. Alternatively, the second gate insulation layer 130 may sufficiently cover the first gate pattern on first gate insulation layer 120, and may have a substantially flat upper surface without a step around the first gate pattern. The second gate insulation layer 130 may include an inorganic insulation material such as a silicon compound or a metal oxide.

The second gate pattern may be disposed on the second gate insulation layer 130. The second gate pattern may include a first gate electrode GE1, a storage electrode CE and a signal line. The storage electrode CE may form a storage capacitor by overlapping the second gate electrode GE2. The second gate pattern may be formed using a metal, an alloy, a metal nitride, a conductive metal oxide, a transparent conductive material, or the like.

The interlayer insulation layer 140 may be disposed on the second gate insulation layer 130 on which the second gate pattern is disposed. The interlayer insulation layer 140 may sufficiently cover the second gate pattern on the second gate insulation layer 130, and may have a substantially flat upper surface without a step around the second gate pattern. The interlayer insulation layer 140 may include an inorganic insulation material such, as a silicon compound or a metal oxide.

The oxide semiconductor OS may be disposed on the interlayer insulation layer 140. The oxide semiconductor OS may overlap the first gate electrode GE1. The oxide semiconductor OS may include an oxide semiconductor material that includes tin (Sn).

The etch stopper ES may be disposed on the oxide semiconductor OS. The etch stopper ES may include an oxide semiconductor material that does not include tin (Sn). The etch stopper ES may cover only a portion of an upper surface of the oxide semiconductor OS to expose an edge portion of the upper surface of the oxide semiconductor OS. In addition, as in the exemplary embodiment of FIG. 2, a contact hole may be formed though the etch stopper ES.

The source-drain pattern may be disposed on the interlayer insulation layer 140 on which the oxide semiconductor OS and the etch stopper ES are disposed. The source-drain pattern may include a first source electrode SE1, a first drain electrode DE1, a second source electrode SE2, and a second drain electrode DE2.

The first drain electrode DE1 may be connected to the etch stopper ES and the oxide semiconductor OS by making contact with the etch stopper ES and the oxide semiconductor OS. The first source electrode SE1 may be spaced apart from the first drain electrode DE1 on the interlayer insulation layer 140 on which the oxide semiconductor OS and the etch stopper ES are disposed. The first source electrode SE1 may be connected to the etch stopper ES and the oxide semiconductor OS by making contact with the etch stopper ES and the oxide semiconductor OS.

The second source electrode SE2 may be electrically connected to the active pattern ACT through a contact hole formed through the interlayer insulation layer 140, the second gate insulation layer 130, and the first gate insulation layer 120. The second drain electrode DE2 may be electrically connected to the active pattern ACT through a contact hole formed through the interlayer insulation layer 140, the second gate insulation layer 130, and the first gate insulation layer 120.

The source-drain pattern may be formed using a metal, an alloy, a metal nitride, a conductive metal oxide, a transparent conductive material, or the like. The source-drain pattern may be formed of a plurality of layers. For example, the source-drain pattern may include a titanium (Ti) layer and a molybdenum (Mo) layer on the titanium layer (Ti/Mo structure). Alternatively, the source-drain pattern may include a titanium (Ti) layer, an aluminum (Al) layer on the titanium layer, and a titanium (Ti) layer on the aluminum layer (Ti/Al/Ti structure)

Accordingly, a first thin film transistor TFT1 including the first gate electrode GE1, the first source electrode SE1, the first drain electrode DE1, and the oxide semiconductor OS may have a bottom gate structure. A second thin film transistor TFT2 including the second gate electrode GE2, the second source electrode SE2, the second drain electrode DE2, and the active pattern ACT may have a top gate structure.

The via insulation layer 150 may be disposed on the first and second thin film transistors TFT1 and TFT2. The via insulation layer 150 may have a single-layer structure, but may have a multi-layer structure including at least two insulation layers.

The light emitting structure 180 may include a first electrode 181, an emission layer 182, and a second electrode 183. The pixel defining layer PDL may be disposed on the via insulation layer 150 on which the first electrode 181 is disposed. The light emitting layer 182 may be disposed on the first electrode 181 exposed through an opening of the pixel defining layer PDL. The second electrode 183 may be disposed on the pixel defining layer PDL and the light emitting layer 182. The thin film encapsulation layer TFE may be disposed on the second electrode 183.

The light emitting structure 180, the pixel defining layer PDL, and the thin film encapsulation layer TFE may be substantially the same as the light emitting structure, pixel defining layer, and thin film encapsulation layer of the display apparatus of FIG. 1. Thus, detailed description will be omitted.

Here, the first thin film transistor TFT1 may be any one of the third transistor T3, the fourth transistor T4, and the seventh transistor T7 of FIG. 4. The second thin film transistor TFT2 may be any one of the first transistor T1, the second transistor T2, the fifth transistor T5, and the sixth transistor T6 of FIG. 4.

FIGS. 6A to 6I are cross-sectional views for explaining a method of manufacturing the display apparatus of FIG. 1.

Figure 6A:
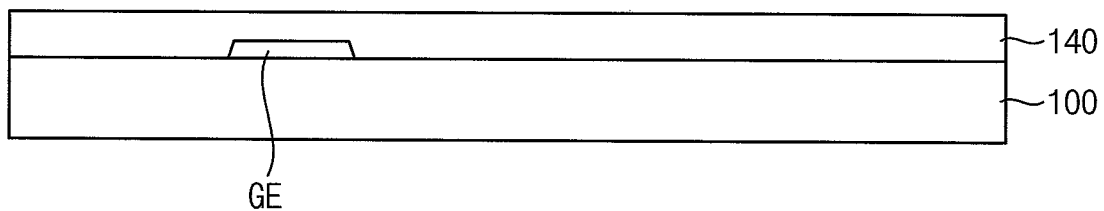
FIGS. 6A, 6B, 6C, 6D, 6E, 6F, 6G, 6H, and 6I are cross-sectional views for explaining a method of manufacturing the display apparatus of FIG. 1.

Referring to FIG. 6A, a gate electrode GE may be formed on a base substrate 100. An interlayer insulation layer 140 may be formed on the base substrate on which the gate electrode GE is formed.

Figure 6B:
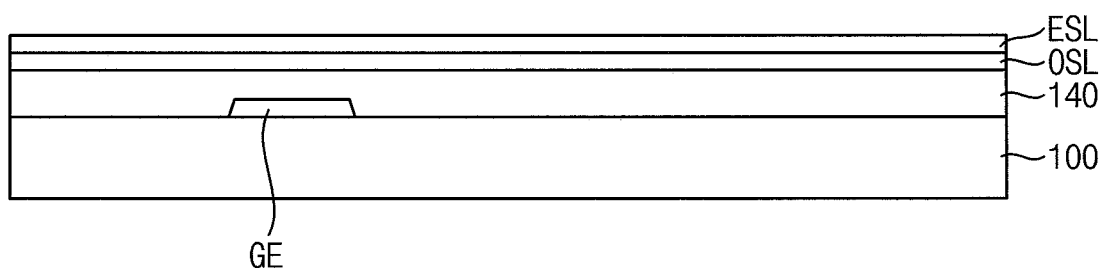

Referring to FIG. 6B, an oxide semiconductor layer OSL may be formed on the interlayer insulation layer 140. An etch stopper layer ESL may be formed on the oxide semiconductor layer OSL.

Figure 6C:
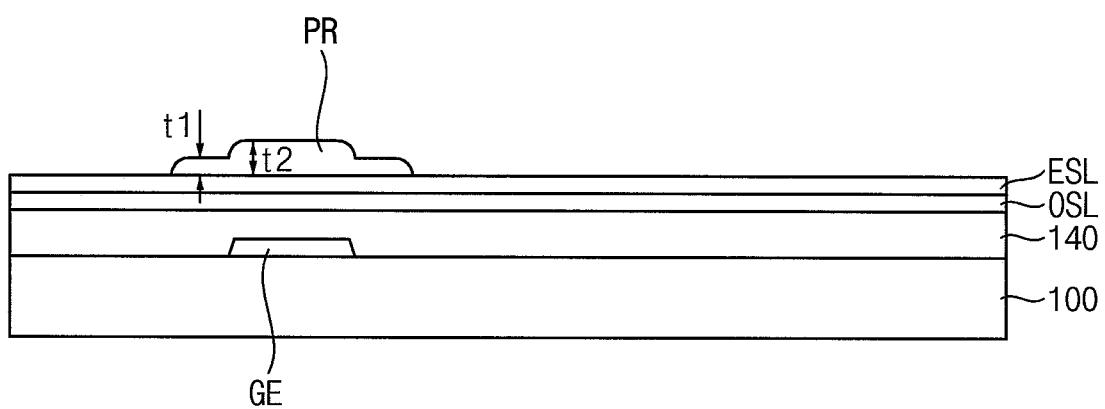

Referring to FIG. 6C, a photoresist pattern PR having a first thickness t1 and a second thickness t2 may be formed on the etch stopper layer ESL. The first thickness t1 may be less than the second thickness t2. A portion of the photoresist pattern PR having the first thickness t1 may correspond to a portion of an oxide semiconductor (which will be described later) exposed by an etch stopper. A portion of the photoresist pattern PR having the second thickness t2 may correspond to the etch stopper. The photoresist pattern PR may be formed using a halftone mask or the like.

Figure 6D:
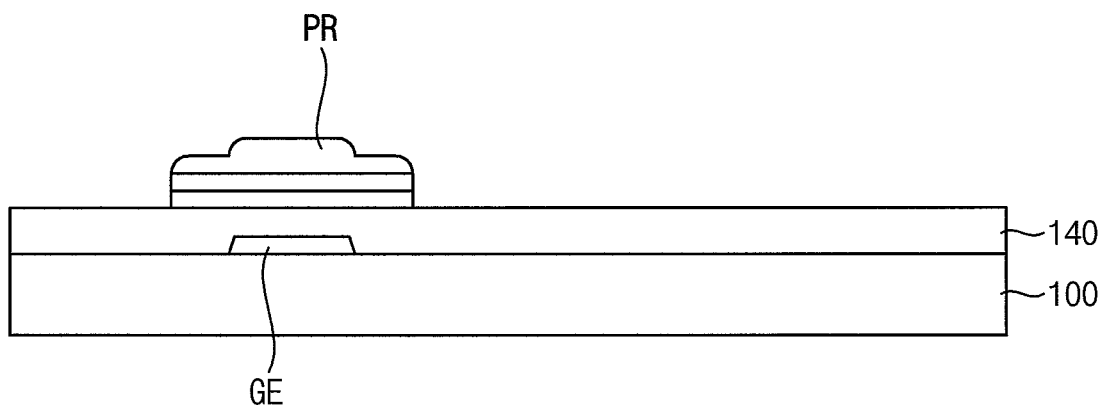

Referring to FIG. 6D, the etch stopper layer ESL and the oxide semiconductor layer OSL may be etched using a photoresist pattern PR as an etching barrier. Thus, an oxide semiconductor OS and an etch stopper pattern ESP can be formed.

For example, the etch stopper layer ESL and the oxide semiconductor layer OSL may be wet etched by an etching solution of hydrofluoric acid or oxalic acid series. The etch stopper layer ESL includes oxide semiconductor material that does not include tin (Sn), and the oxide semiconductor layer OSL includes oxide semiconductor that includes tin (Sn), so that both of the etch stopper layer ESL and the oxide semiconductor layer OSL may be wet-etched using the above-mentioned etching solution of hydrofluoric acid or oxalic acid series.

Figure 6E:
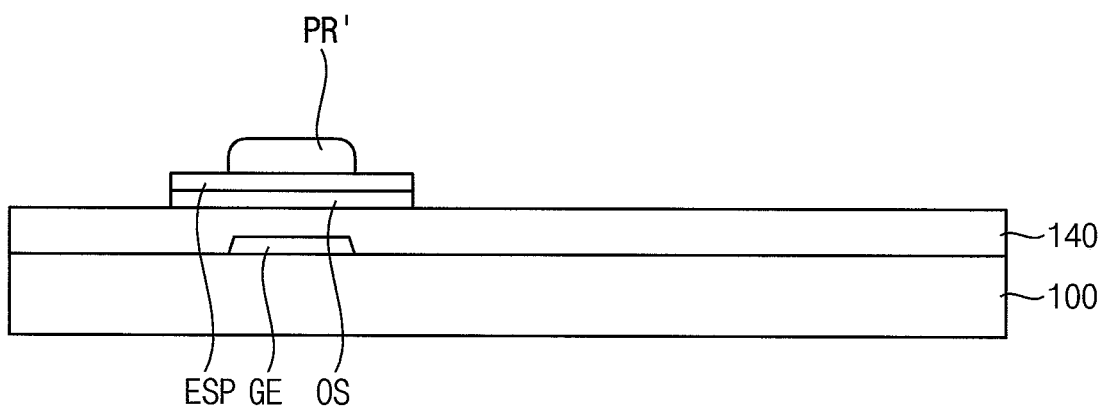

Referring to FIG. 6E, a portion of an upper surface of the etch stopper pattern ESP may be exposed by partially removing the photoresist pattern PR.

For example, the photoresist pattern PR may be entirely thinned through an ashing process or the like, so that the portion having the first thickness t1 is removed, leaving just the center portion PR' having the second thickness t2. The portion of the upper surface of the etch stopper pattern ESP can be exposed.

Figure 6F:
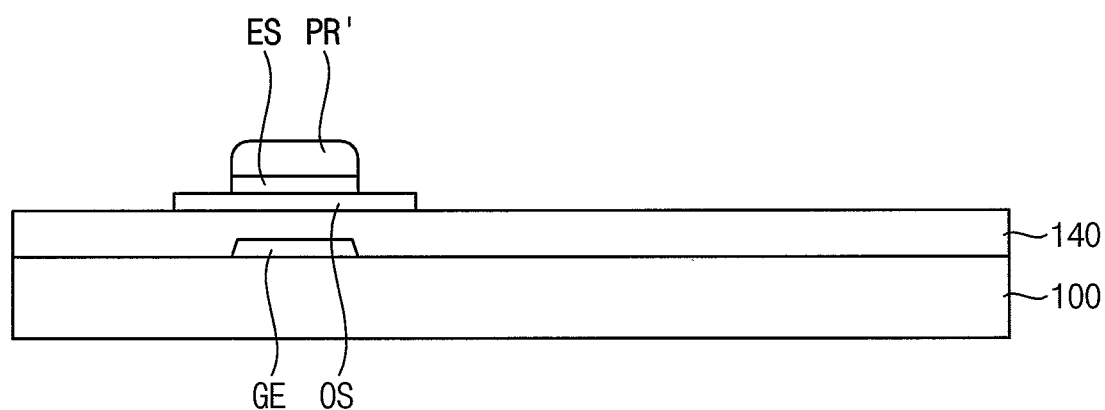

Referring to FIG. 6F, the etch stopper pattern ESP may be etched using the photoresist pattern PR as an etch barrier to form a etch stopper ES.

For example, the etch stopper pattern ESP may be wet-etched by an etching solution of phosphoric-nitric-acetic acid series. At this time, since the etch stopper pattern ESP includes the oxide semiconductor material that does not include tin, it is etched by the etchant of the phosphoric-nitric-acetic acid series. However, since the oxide semiconductor OS includes the oxide semiconductor material including tin, etch selectivity for the phosphoric-nitric-acetic acid series etchant is low and remains unremoved. Accordingly, a portion of the upper surface of the oxide semiconductor OS may be exposed. Thereafter, the photoresist PR can be removed.

Meanwhile, the method of manufacturing the display apparatus may further include an annealing process for heating the oxide semiconductor OS, and a plasma process for improving electrical conductivity of the oxide semiconductor OS.

Figure 6G:
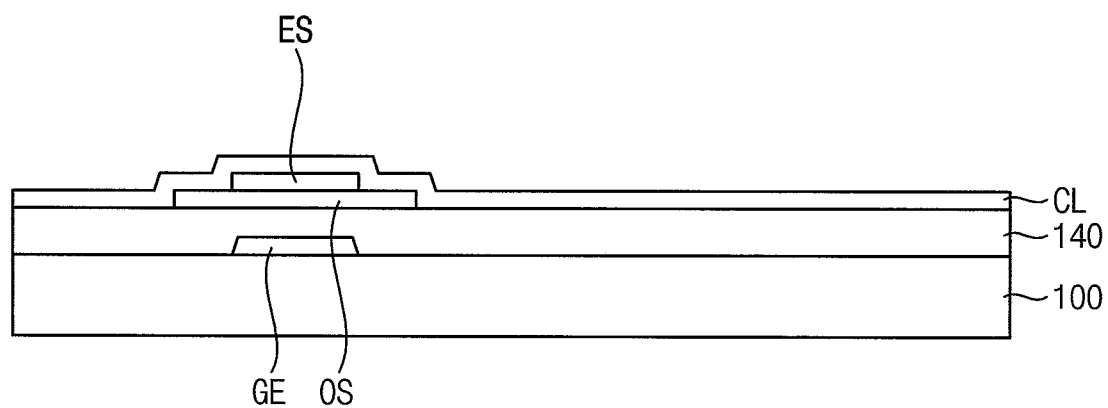

Referring to FIG. 6G, a conductive layer CL may be formed on the interlayer insulation layer 140 on which the etch stopper ES and the oxide semiconductor OS are formed. The conductive layer CL may include a plurality of metal layers.

Figure 6H:
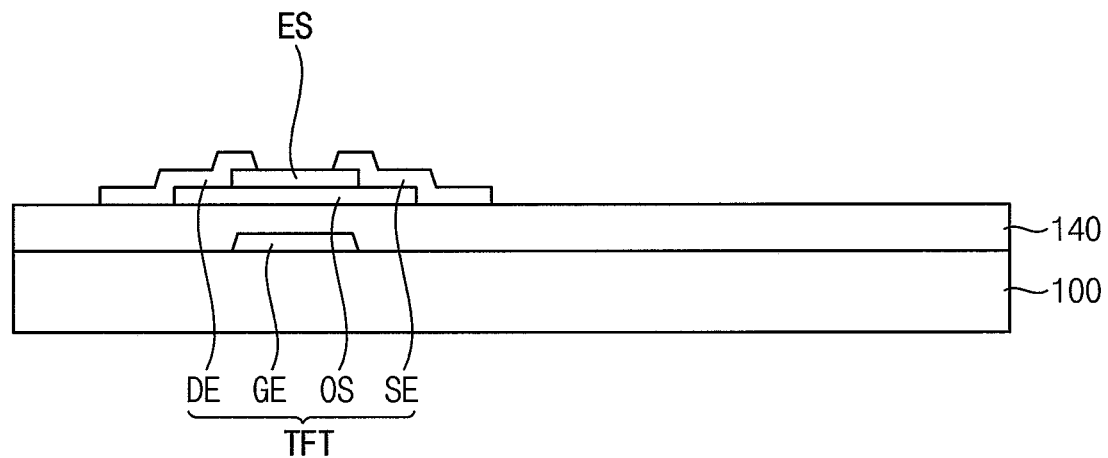

Referring to FIG. 6H, a source electrode SE and a drain electrode DE may be formed by etching the conductive layer CL. For example, the source electrode SE and the drain electrode DE may be formed by patterning the conductive layer CL using a photolithography process or an etching process using an additional etching mask. Here, since the oxide semiconductor OS is covered by the etch stopper ES, and the etch stopper ES includes the oxide semiconductor material that does not include tin, it is possible to protect the oxide semiconductor OS in the process of etching the conductive layer CL.

For example, the conductive layer CL may be dry-etched by a fluorine-based gas. Thus, a thin film transistor TFT may be formed. The oxide semiconductor OS including the oxide semiconductor material including tin and may be damaged by the fluorine-based gas. However, since the oxide semiconductor OS is protected by the etch stopper ES, properties of the oxide semiconductor OS do not change, and thus, the dispersion of the thin film transistors in a final product can be reduced.

Since the source electrode SE and the drain electrode DE are patterned by the dry etching, a finer pattern can be formed, and a size of the thin film transistor TFT can be further reduced.

Figure 6I:
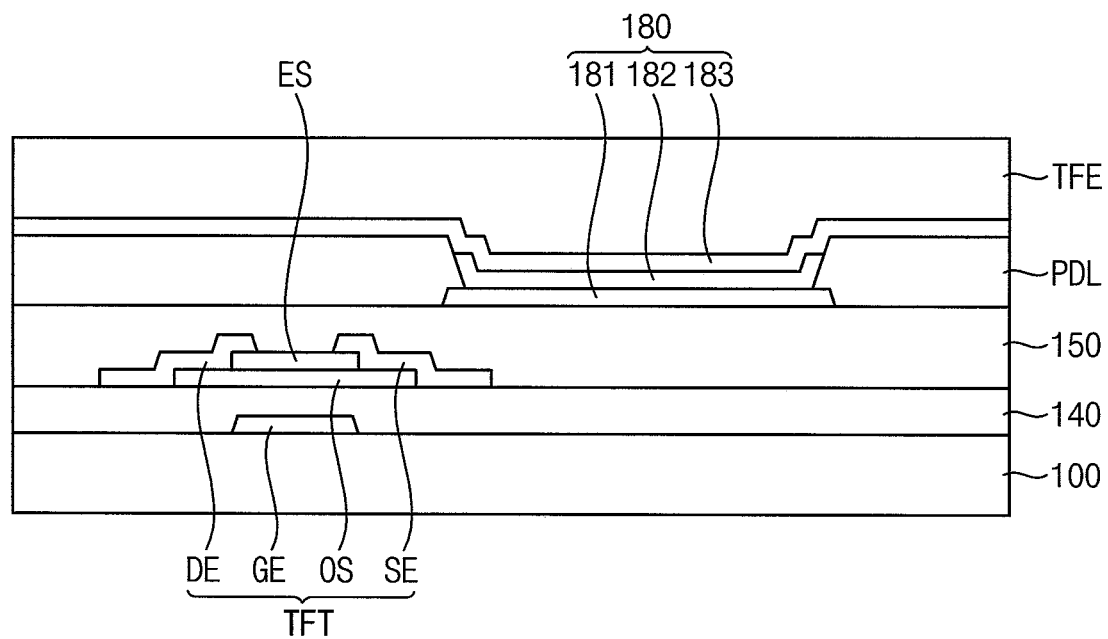

Referring to FIG. 6I, a via insulation layer 150, a first electrode 181, a pixel defining layer PDL, a light emitting layer 182, a second electrode 183, and a thin film encapsulation layer TFE may be formed on the thin film transistor TFT. Therefore, the display apparatus may be manufactured. The via insulation layer 150, the first electrode 181, the pixel defining layer PDL, the light emitting layer 182, the second electrode 183, and the thin film encapsulation layer TFE may be formed by various known methods, and a detailed description thereof will be omitted.

FIGS. 7A to 7H are cross-sectional views for explaining a method of manufacturing the display apparatus of FIG. 2. The method of manufacturing the display apparatus is substantially the same as the method of FIGS. 6A to 6I except for first and second contact holes of the etch stopper. Therefore, repetitive description will be simplified or omitted.

Figure 7A:
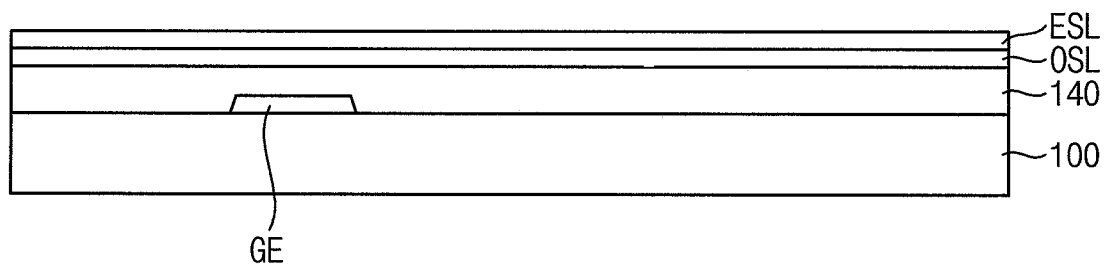
FIGS. 7A, 7B, 7C, 7D, 7E, 7F, 7G, and 7H are cross-sectional views for explaining a method of manufacturing the display apparatus of FIG. 2.

Referring to FIG. 7A, a gate electrode GE may be formed on a base substrate 100. An interlayer insulation layer 140 may be formed on the base substrate on which the gate electrode GE is formed. An oxide semiconductor layer OSL may be formed on the interlayer insulation layer 140. An etch stopper layer ESL may be formed on the oxide semiconductor layer OSL.

Figure 7B:
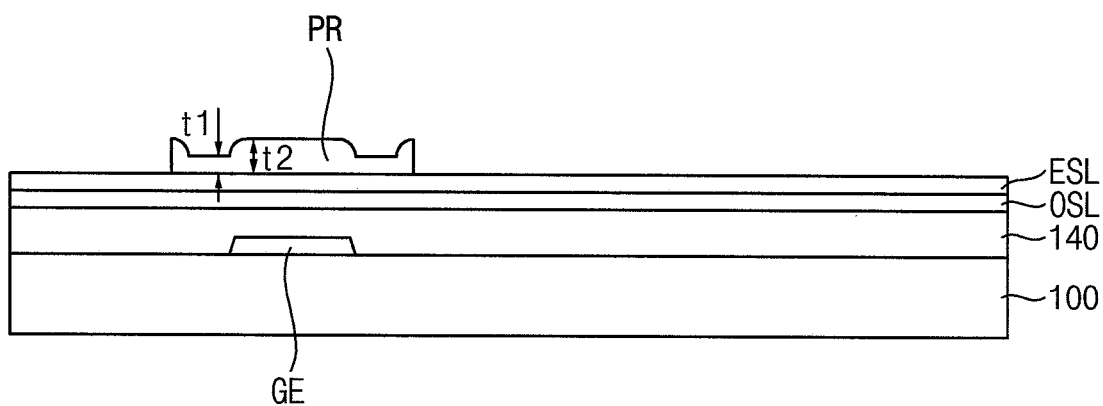

Referring to FIG. 7B, a photoresist pattern PR having a first thickness t1 and a second thickness t2 may be formed on the etch stopper layer ESL. The first thickness t1 may be less than the second thickness t2. A portion of the photoresist pattern PR having the first thickness t1 may correspond to a portion of an oxide semiconductor which will be described later exposed by an etch stopper. A portion of the photoresist pattern PR having the second thickness t2 may correspond to the etch stopper. The photoresist pattern PR may be formed using a halftone mask or the like.

Figure 7C:
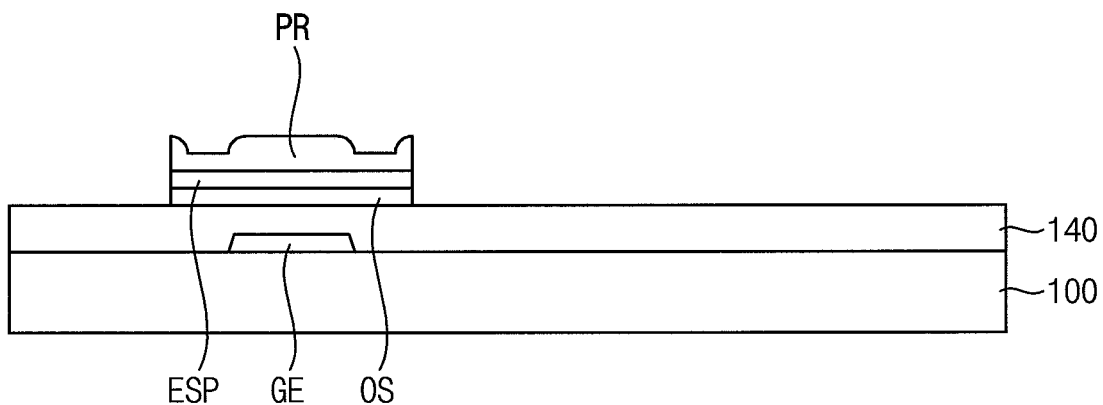

Referring to FIG. 7C, the etch stopper layer ESL and the oxide semiconductor layer OSL may be etched using a photoresist pattern PR as an etching barrier. Thus, an oxide semiconductor OS and an etch stopper pattern ESP can be formed.

Figure 7D:
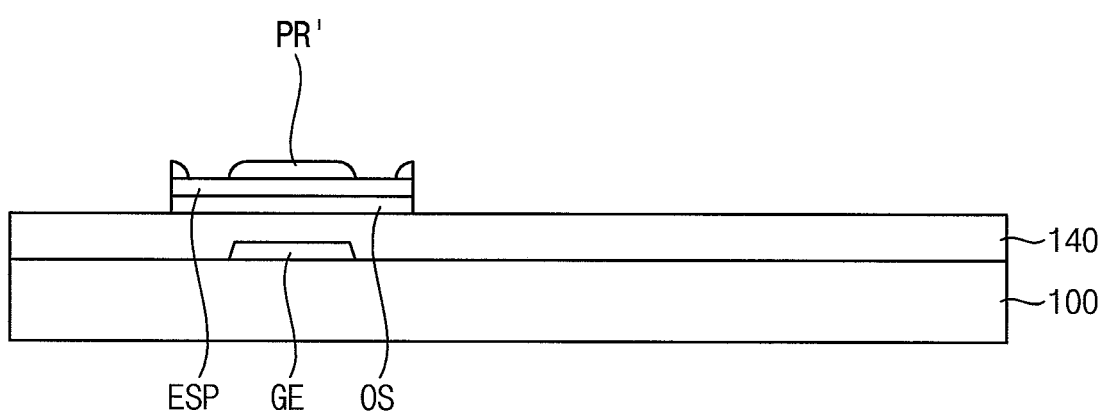

Referring to FIG. 7D, a portion of an upper surface of the etch stopper pattern ESP may be exposed by partially removing the photoresist pattern PR, thereby leaving a center portion PR'.

Figure 7E:
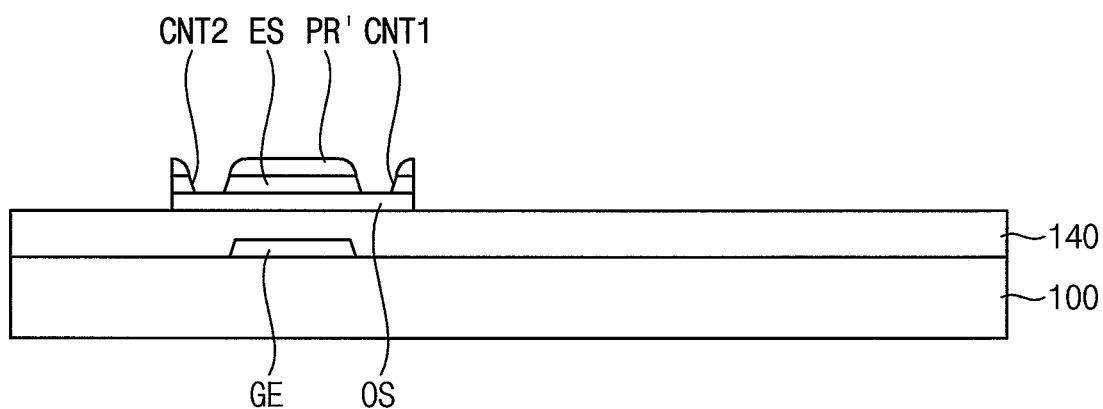
Figure 7F:
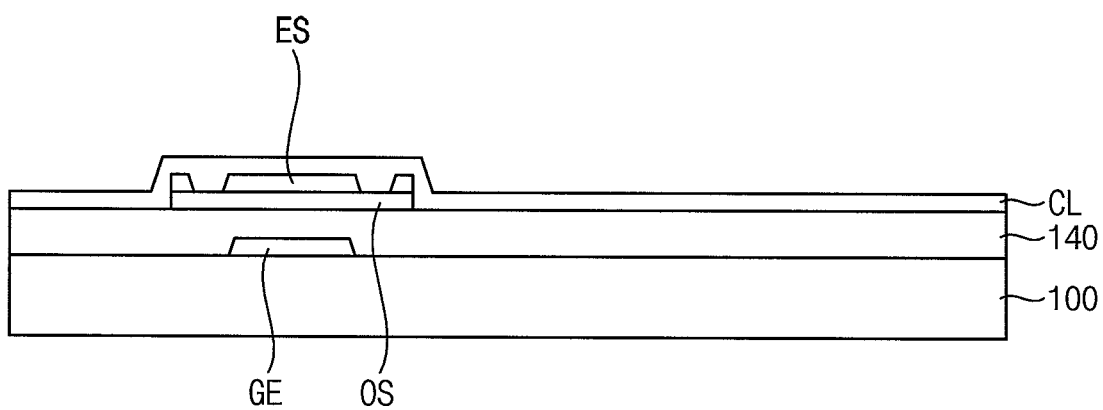

Referring to FIG. 7E, first and second contact holes CNT1 and CNT2 may be formed through an etch stopper ES by etching the etch stopper pattern ESP using the photoresist pattern PR as an etching barrier, Referring to FIG. 7F, a conductive layer CL may be formed on the interlayer insulation layer 140 on which the etch stopper ES and the oxide semiconductor OS are formed.

Figure 7G:
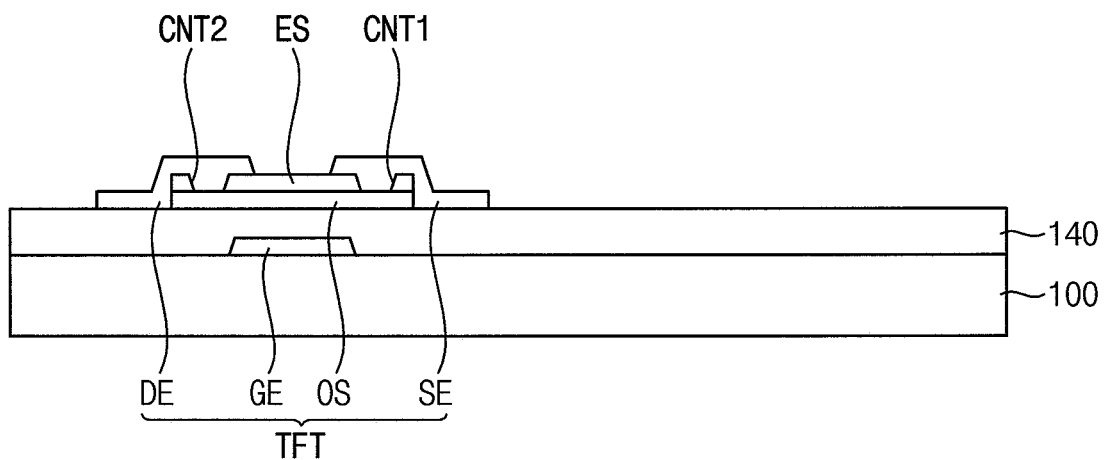

Referring to FIG. 7G, a source electrode SE and a drain electrode DE may be formed by etching the conductive layer CL. Accordingly, a thin film transistor TFT can be formed.

Figure 7H:
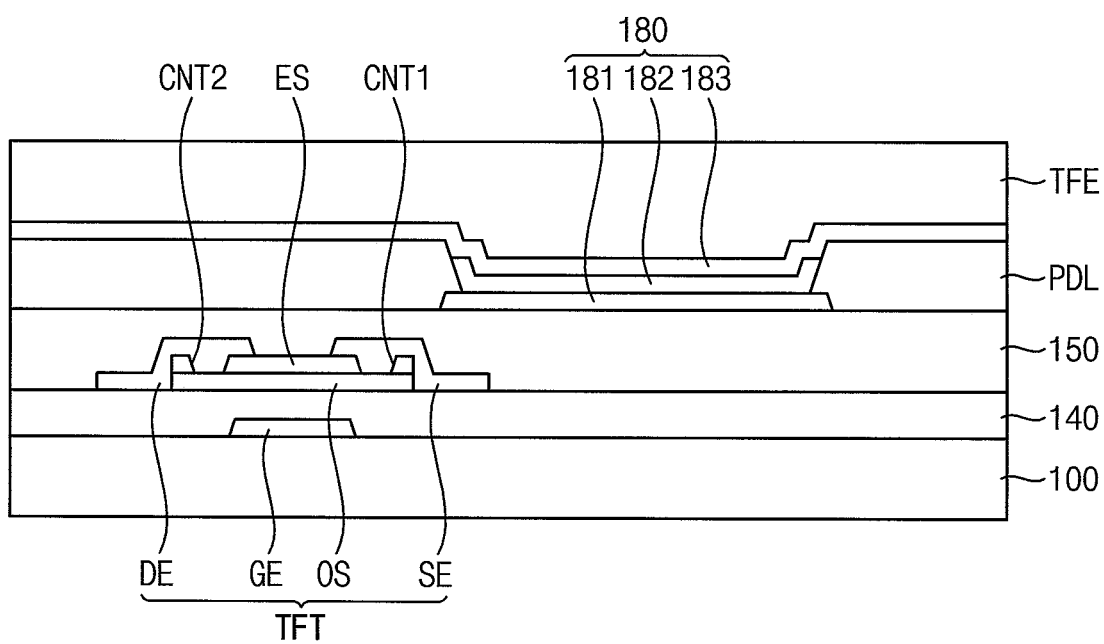

Referring to FIG. 7H, a via insulation layer 150, a first electrode 181, a pixel defining layer PDL, a light emitting layer 182, a second electrode 183, and a thin film encapsulation layer TFE may be formed on the thin film transistor TFT. Therefore, the display apparatus may be manufactured.

FIGS. 8A to 8E are cross-sectional views for explaining a method of manufacturing the display apparatus of FIG. 5. The method of manufacturing the display apparatus is substantially the same as the method of FIGS. 6A to 6I except for a buffer layer, an active pattern, first and second insulation layers, first and second gate patterns. Therefore, repetitive description will be simplified or omitted.

Figure 8A:
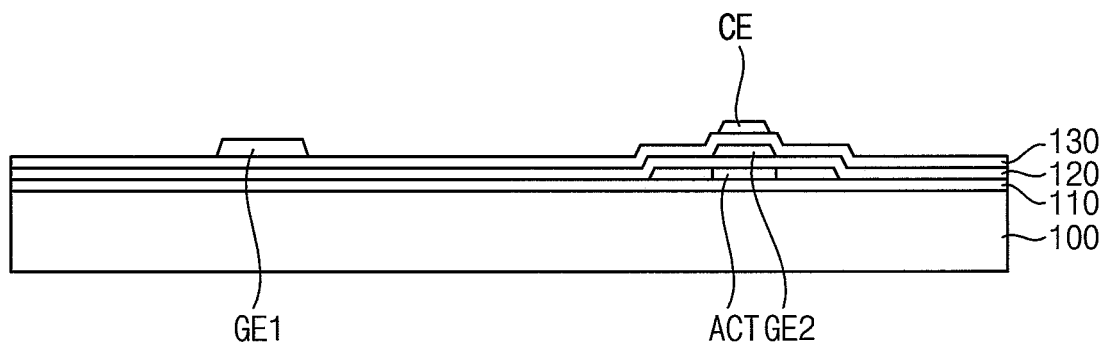
FIGS. 8A, 8B, 8C, 8D, and 8E are cross-sectional views for explaining a method of manufacturing the display apparatus of FIG. 5.

Referring to FIG. 8A, a buffer layer 110 may be formed on a base substrate 100. An active pattern ACT may be formed on the buffer layer 110. The active pattern ACT may be formed by forming an amorphous silicon layer, crystallizing the amorphous silicon layer and patterning the amorphous silicon layer by a photolithography method or the like. A first gate insulation layer 120 may be formed on the active pattern ACT. A first gate pattern including a second gate electrode GE2 may be formed on the first gate insulation layer 120. A second gate insulation layer 130 may be formed on the first gate insulation layer 120 on which the first gate pattern is formed. A second gate pattern including a storage electrode CE and a first gate electrode GE1 may be formed on the second gate insulation layer 130.

Figure 8B:
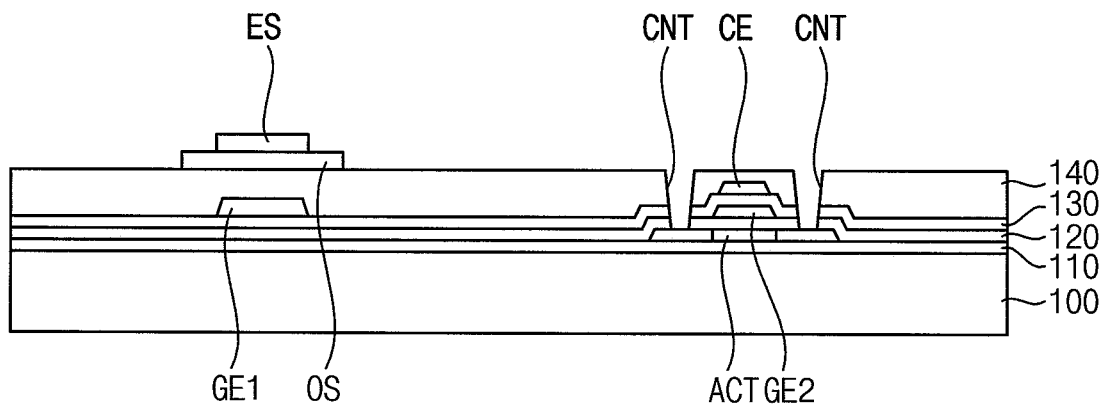

Referring to FIG. 8B, an interlayer insulation layer 140 may be formed on the second gate insulating layer 130 on which the first gate pattern is formed. A contact hole CNT may be formed through the interlayer insulation layer 140. An oxide semiconductor OS and an etch stopper ES may be formed on the interlayer insulation layer 140. Here, a method of forming the oxide semiconductor OS and the etch stopper ES may be substantially the same as the method shown in FIGS. 6B to 6F.

Figure 8C:
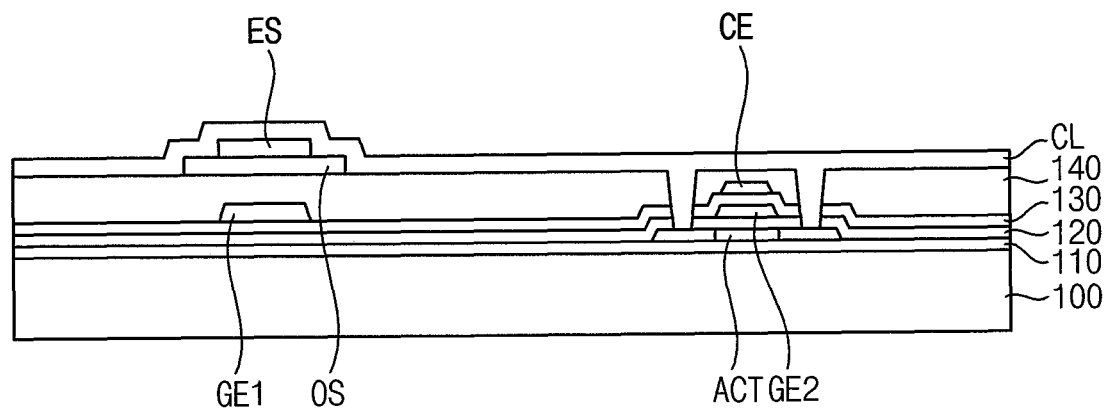

Referring to FIG. 8C, a conductive layer CL may be formed on the interlayer insulation layer 140 on which the etch stopper ES and the oxide semiconductor OS are formed. The conductive layer CL may include a plurality of metal layers.

Figure 8D:
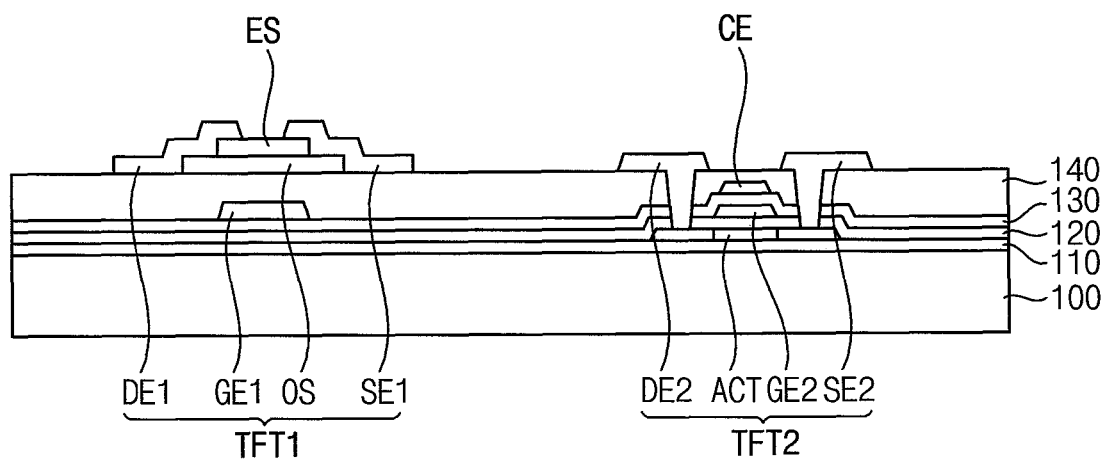

Referring to FIG. 8D, a source-drain pattern including a first source electrode SE1, a first drain electrode DE1, a second source electrode SE2, and a second drain electrode DE2 may be formed by etching the conductive layer CL. For example, the source-drain pattern may be formed by patterning the conductive layer CL using a photolithography process or an etching process using an additional etching mask. For example, the conductive layer CL may be dry-etched by a fluorine-based gas. Thus, the first and second thin film transistors TFT1 and TFT2 can be formed.

Figure 8E:
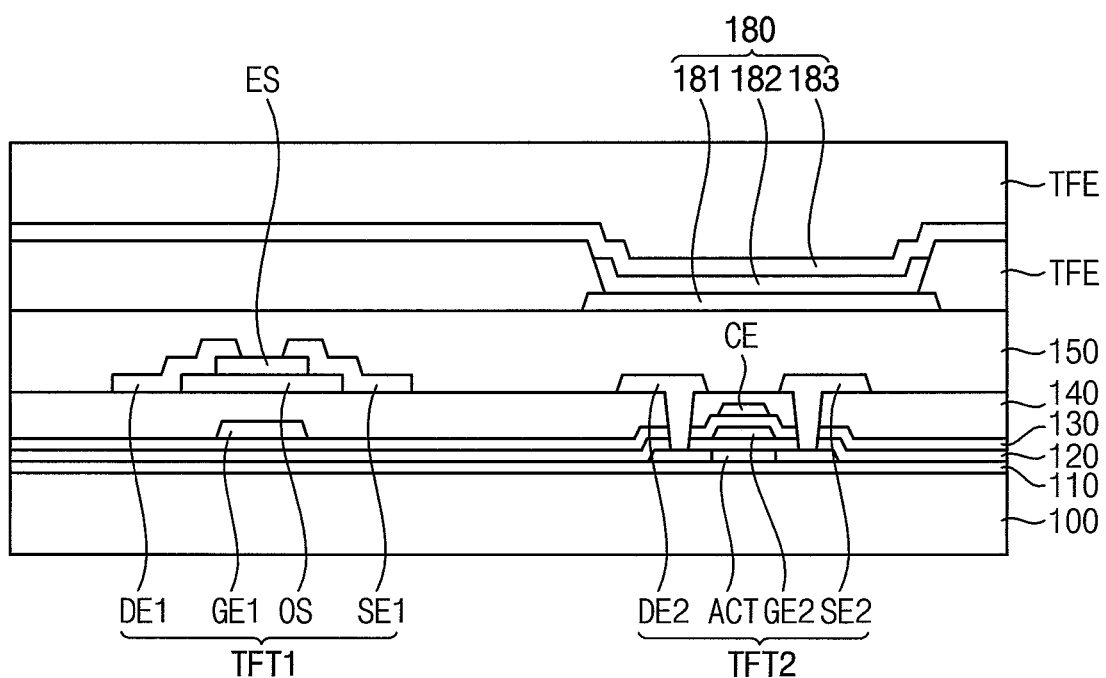

Referring to FIG. 8E, a via insulation layer 150, a first electrode 181, a pixel defining layer PDL, a light emitting layer 182, a second electrode 183, and a thin film encapsulation layer TFE may be formed on the first and second thin film transistors TFT1 and TFT2. Therefore, the display apparatus may be manufactured.

According to exemplary embodiments of the present invention, the display apparatus includes a thin film transistor including an oxide semiconductor and an etch stopper. The thin film transistor TFT has a bottom gate structure, has a shorter channel length than that of a top gate structure, and does not need to form a separate contact hole. In addition, in a manufacturing process, since the etch stopper protects the oxide semiconductor, thickness and size of the oxide semiconductor are constant, thereby reducing dispersion of a plurality of thin film transistors included in the display apparatus. In addition, since the source and drain electrodes can be patterned by a dry etching process, the size of the thin film transistor can be further reduced. Accordingly, this is advantageous for realizing a high-resolution display apparatus.

Figure 9:
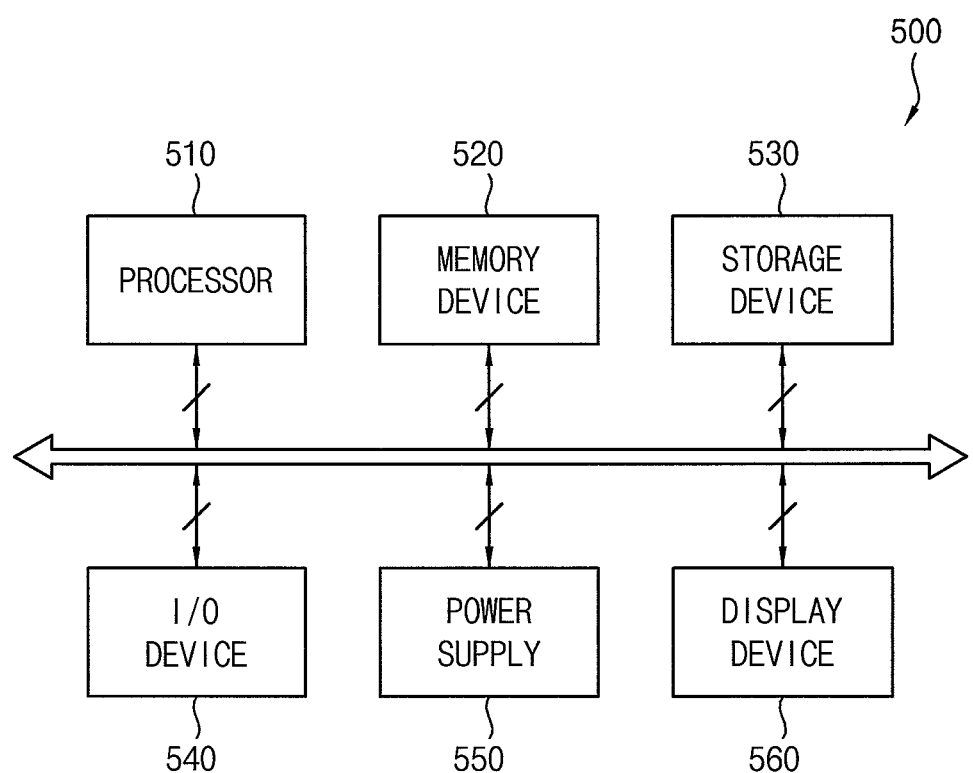
FIG. 9 is a block diagram illustrating an electronic device according to example embodiments.
Figure 10A:
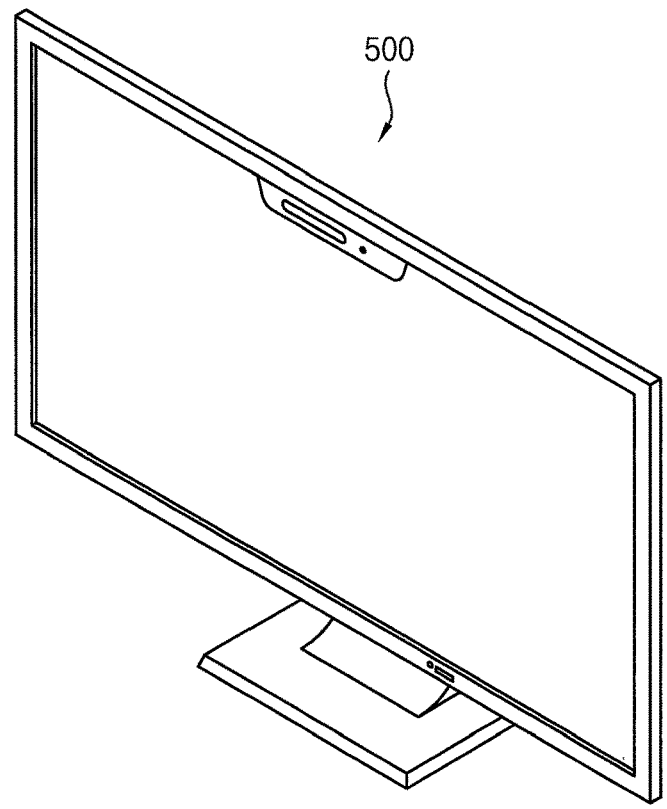
FIG. 10A is a diagram illustrating an example in which the electronic device of FIG. 9 is implemented as a television.
Figure 10B:
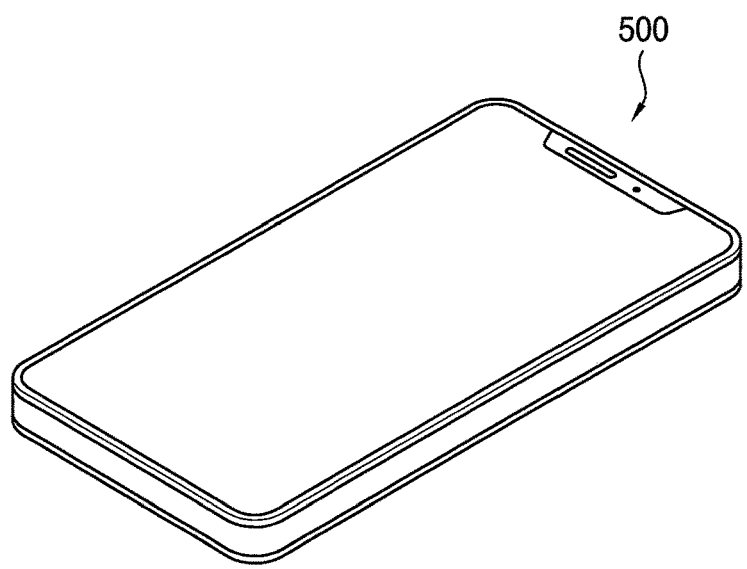
FIG. 10B is a diagram illustrating an example in which the electronic device of FIG. 9 is implemented as a smart phone.

FIG. 9 is a block diagram illustrating an electronic device according to example embodiments. FIG. 10A is a diagram illustrating an example in which the electronic device of FIG. 9 is implemented as a television. FIG. 10B is a diagram illustrating an example in which the electronic device of FIG. 9 is implemented as a smart phone.

Referring to FIGS. 9 through 10B, the electronic device 500 may include a processor 510, a memory device 520, a storage device 530, an input/output (I/O) device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus (USB) device, other electronic devices, etc. In an example embodiment, as illustrated in FIG. 12A, the electronic device 500 may be implemented as a television. In another example embodiment, as illustrated in FIG. 12B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus, such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc and an output device such as a printer, a speaker, etc. The power supply 550 may provide power for operations of the electronic device 500.

The display device 560 may be coupled to other components via the buses or other communication links. In some example embodiments, the display device 560 may be included in the I/O device 540. As described above, the display device 560 may include a thin film transistor having a bottom gate structure with an oxide semiconductor and an etch stopper. Accordingly, dispersion of the thin film transistors can be reduced and a high resolution can be realized. However, since this has been described above, a duplicate description thereof will be omitted.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
a base substrate;
a first thin film transistor disposed on the base substrate;
a via insulation layer disposed on the first thin film transistor; and a light emitting structure disposed on the via insulation layer, wherein:

the first thin film transistor comprises:
- a first gate electrode;
  - an oxide semiconductor overlapped with the first gate electrode, and comprising tin (Sn);
  - an etch stopper disposed on the oxide semiconductor and comprising an oxide semiconductor material which does not include tin (Sn);
- a first source electrode making contact with the oxide semiconductor; and
  - a first drain electrode in contact with the oxide semiconductor, and spaced apart from the first source electrode;

the oxide semiconductor consists of at least one selected from the group consisting of indium-gallium-tin oxide (IGTO) and indium-gallium-zinc-tin-oxide (IGZTO); and the etch stopper consists of at least one selected from the group consisting of zinc oxide ($ZnO_x$), indium oxide ($InO_x$), indium-gallium oxide (IGO), indium-zinc oxide (IZO), gallium-zinc oxide (GZO), zinc-magnesium oxide (ZMO), zinc-zirconium oxide ($ZnZr_xO_y$), and indium-gallium-hafnium oxide (IGHO).

2. The display apparatus of claim 1, wherein the first gate electrode is disposed between the base substrate and the oxide semiconductor.

3. The display apparatus of claim 2, wherein:

the etch stopper covers only a portion of an upper surface of the oxide semiconductor; and the first source electrode and the first drain electrode contact the upper surface of the oxide semiconductor.

4. The display apparatus of claim 2, wherein:

contact holes are formed through the etch stopper to expose an upper surface of the oxide semiconductor; and the first source electrode and the first drain electrode contact the oxide semiconductor through the contact holes.

5. The display apparatus of claim 1, further comprising:

an interlayer insulation layer disposed on the first gate electrode and the oxide semiconductor; and a second thin film transistor disposed on the base substrate, wherein the second thin film transistor comprises:
- an active pattern disposed on the base substrate;
- a second gate electrode disposed on the active pattern; and
  - a second source electrode and a second drain electrode disposed on the interlayer insulation layer and electrically connected to the active pattern.

6. The display apparatus of claim 5, wherein the light emitting structure comprises:

a first electrode electrically connected to the second thin film transistor;

a light emitting layer disposed on the first electrode; and a second electrode disposed on the light emitting layer.

7. The display apparatus of claim 6, wherein:

the display apparatus comprises a plurality of pixels to display an image; and each of the pixel comprises the first thin film transistor, the second thin film transistor, and the light emitting structure.

8. The display apparatus of claim 5, wherein the second gate electrode comprises a storage electrode overlapped with the second gate electrode.

* * * * *